United States Patent [19]

Mishima et al.

[11] Patent Number: 5,003,366
[45] Date of Patent: Mar. 26, 1991

[54] HETERO-JUNCTION BIPOLAR TRANSISTOR

[75] Inventors: Tomoyoshi Mishima, Shiki; Junichi Kasai, Setagaya; Yoshimasa Murayama, Koganei, all of Japan

[73] Assignee: Hitachi, Ltd., Tokyo, Japan

[21] Appl. No.: 542,796

[22] Filed: Jun. 25, 1990

Related U.S. Application Data

[63] Continuation of Ser. No. 243,039, filed as PCT JP87/00935 or Dec. 2, 1987, published as WO88/04474 on Jun. 16, 1988, abandoned.

[30] Foreign Application Priority Data

Dec. 3, 1986 [JP]  Japan ................... 61-286605

[51] Int. Cl.⁵ ............... H01L 27/12; H01L 29/161; H01L 29/72
[52] U.S. Cl. ........................ 357/34; 357/4; 357/16
[58] Field of Search ............... 357/34, 4, 16

[56]  References Cited

U.S. PATENT DOCUMENTS

| 4,503,447 | 3/1985 | Iafiate et al. | 357/57 |
| 4,816,878 | 3/1989 | Kano et al. | 357/16 |
| 4,849,799 | 7/1989 | Capasso et al. | 357/26 |

FOREIGN PATENT DOCUMENTS

| 0255288 | 2/1988 | European Pat. Off. | 357/34 |
| 0268512 | 5/1988 | European Pat. Off. | 357/34 |
| 62-40771 | 2/1987 | Japan | 357/34 |

Primary Examiner—J. Carroll
Attorney, Agent, or Firm—Antonelli, Terry, Stout & Kraus

[57] ABSTRACT

The present invention provides a hetero-junction bipolar transistor (HBT) which is so designed that the emitter injection efficiency is improved, the base transit time and base resistance are reduced and yet the lowering of the collector injection efficiency is suppressed, by forming at least one quantum well in a base region of the HBT and determining the width of one of the quantum levels formed in the quantum well and the energy in a barrier layer constituting the quantum well is within $kT/2$.

5 Claims, 2 Drawing Sheets

HETERO-JUNCTION BIPOLAR TRANSISTOR

This application is a continuation-in-part of application Ser. No. 243,039, filed as PCT JP87/00935 on Dec. 2, 1987, published as WO88/04474 on Jun. 16, 1988.

TECHNICAL FIELD

The present invention relates to a high-speed and high-gain transistor and, more particularly, to a hetero-junction bipolar transistor having a hetero-junction.

BACKGROUND ART

As a device having performance exceeding the limits of that of silicon bipolar transistors, there is a hetero-junction bipolar transistor (hereinafter referred to as "HBT"). The HBT has, as will be clear from FIG. 1 which shows the energy band diagram thereof, a hetero-junction 4 which is formed between an emitter region 2 and a base region 1 to thereby make the energy bandgap of the emitter wider than that of the base. In the figure, 3 denotes a collector region. Attempts have been vigorously made to realize HBTs using compound semiconductors, and it has become possible to realize HBTs as a result, particularly, of the recent progress in epitaxial growth technology or the like.

The feature of HBTs resides in that, since there is substantially no injection of minority carriers from the base into the emitter, it is possible to increase the impurity concentration in the base while maintaining the emitter injection efficiency at a high level. Therefore, it is possible to narrow the base width and lower the internal base resistance. As a result, it is possible to improve the current gain and cut-off frequency of the transistor as compared with the conventional bipolar transistors.

As one technique used to further improve various characteristics of the above-described HBT, for example, a proposition made by Ito et al. in Extended Abstracts (The 46th Autumn Meeting, 1985) 3a-B-9; The Japan Society of Applied Physics may be cited. It is described in this literature that it is possible to reduce the transit time of electrons and increase the current gain by sloping the Al composition in the base layer of an AlGaAs/GaAs HBT. However, in the above-described prior art, the base layer is a heavily-doped p-type layer and therefore it has the problem that the hole mobility is small. Accordingly, lowering in the base resistance is limited, and this leads to restrictions on the high-frequency characteristics.

It is described in Japanese Patent Laid-Open No. 60-10775 that the base resistance is reduced by forming a base region having a superlattice structure and thus shortening the switching time and improving the high-frequency characteristics. This prior art suffers, however, from the problem that the collector injection efficiency is lowered as a result of recombination of carriers inside the base region.

DISCLOSURE OF INVENTION

It is an object of the present invention to provide an HBT which is so designed that the emitter injection efficiency is improved, the base transit time and base resistance are reduced and yet the lowering of the collector injection efficiency is suppressed.

To attain the above-described object, according to the present invention, an HBT is provided in its base region with at least one quantum well which is formed from a well layer defined by a semiconductor layer having a relatively small energy bandgap and a barrier layer defined by a semiconductor layer having a relatively large energy bandgap which is formed adjacent to the well layer, and the combination of the well width of the above-described quantum well (i.e., the thickness of the semiconductor defining the above-described well layer) and the difference between the respective energy bandgaps of the barrier layer and the well layer is determined so that the energy difference between one of the quantum levels formed in the quantum well and the conduction band of the barrier layer that constitutes the quantum well is within kT/2. It should be noted that k is the Boltzmann's constant and T is the absolute temperature.

It is known that, in a double-hetero structure of semiconductors, if the thickness of a semiconductor layer having a relatively narrow energy bandgap which is sandwiched between two layers is reduced, a quantum size effect is produced. Such a structure is known as a quantum well which is formed from a semiconductor having a narrow energy bandgap which constitutes a well layer and a semiconductor barrier layer having a wide energy bandgap which is adjacent to the well layer. In other words, in this quantum well the electron energy is no longer continuous but split. More specifically, assuming that the well width is Lw, the quantum level $\Delta E_n$ measured from the bottom of the energy band may be approximated as follows:

$$\Delta E_n = (\hbar^2/2m^*)(n\pi/L_w)^2$$

In the above formula, n is an integer, and the depth of the well is approximated to be sufficiently deep.

Examination of the light-emitting efficiency from the quantum well in a GaAs/AlGaAs light-emitting device has found that the light-emitting efficiency is periodically changed as shown in FIG. 3 by changing the well width.

This shows that trapping of carriers formed in the barrier layer (AlGaAs) into the quantum well depends on the well width. It has been found that the trapping of carriers reaches a minimum value when the quantum level $\Delta E_n$ of the uppermost electrons in the quantum well is substantially coincident (about $\pm kT/2$) with the conduction band of the barrier layer. This condition is referred to as the resonant condition.

The present invention applies to an HBT the fact that the above-described, carrier trapping efficiency depends on the quantum width to a substantial extent. By making the quantum level $\Delta E_n$ and the conduction band of the barrier layer coincident with each other within about $\pm kT/2$, various characteristics of the HBT are improved as follows.

FIG. 2 shows the energy band diagram of the HBT according to the present invention. The base region 27 has a quantum well 32 formed therein.

First, as to the emitter injection efficiency, holes 28 are two-dimensionally trapped in the quantum well 32 and thus prevented from being injected into the emitter region 29, so that the emitter injection efficiency is improved. In the case where holes are needed in the base at a high density, it suffices to dope an acceptor into the barrier layer 33 by modulation dope.

Next, as to the base transit time and the base resistance, since electrons which are injected into the base region 27 from the emitter region 29 reach ballistically the collector region 31 without being trapped in the quantum well 32, the base transit time can be reduced without lowering in the collector injection efficiency which would otherwise be caused by recombination taking place in the base. In particular, when the above-described modulation dope is effected with respect to the barrier layer, holes in the base layer has a mobility which is about 4 times as high as that of holes in the conventional base layer, so that the base resistance can be lowered by a large margin and it is therefore possible to reduce the charge and discharge time in relation to the base layer.

Although it has been mentioned in the foregoing description that the quantum level and the conduction band of the barrier layer are made coincident with each other within a range of about $\pm kT/2$, this is due to the following reasons. When the HBT is operated, a voltage is, of course, applied between electrodes, and since the application of a voltage causes a change in potential of the quantum well, the resonant condition also changes, although the extent to which it changes is slight. In the case where a quantum well is formed in the base region, there are unavoidably some variations in the thickness. However, it is a matter of course that electrons which are injected from the emitter also has an energy distribution, which is estimated to be about $\pm kT/2$. Accordingly, in order that almost all the injected electrons are in a substantially resonant condition, it is necessary to make the quantum level and the conduction band of the barrier layer coincident with each other within a range of about $\pm kT/2$.

The number of quantum wells is not necessarily limited to one, and a plurality of quantum wells may be provided. In this case, the above-described relationship between the quantum well and the energy in the barrier layer must be satisfied for each of the quantum wells. Each pair of adjacent quantum wells are preferably spaced apart from each other at such a distance that there is no interaction between the quantum wells. This is because any interaction would change the quantum level by a large margin, resulting in a change in the carrier trapping conditions considered in relation to a single well. The distance at which no interaction occurs is, specifically, a distance which is longer than the de Broglie wavelength of electrons.

It should be noted that, when the present invention is carried out, it is preferable to use a direct bandgap semiconductor as a semiconductor constituting the barrier layer.

BEST MODE FOR CARRYING OUT THE INVENTION

Figure 1:
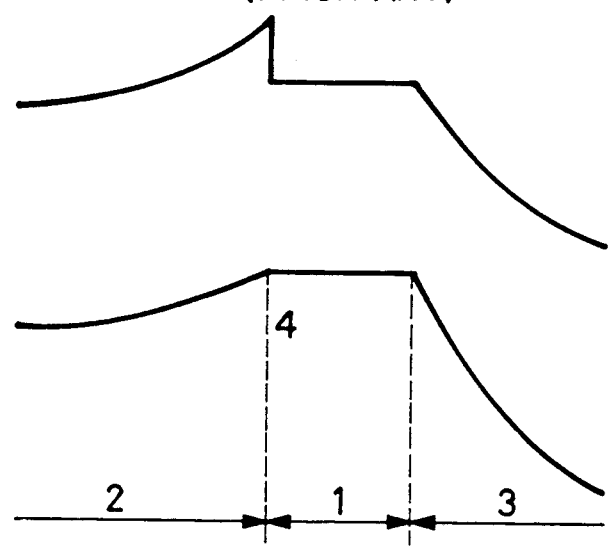
FIG. 1 shows the energy band diagram of a conventional hetero-junction bipolar transistor.
Figure 2:
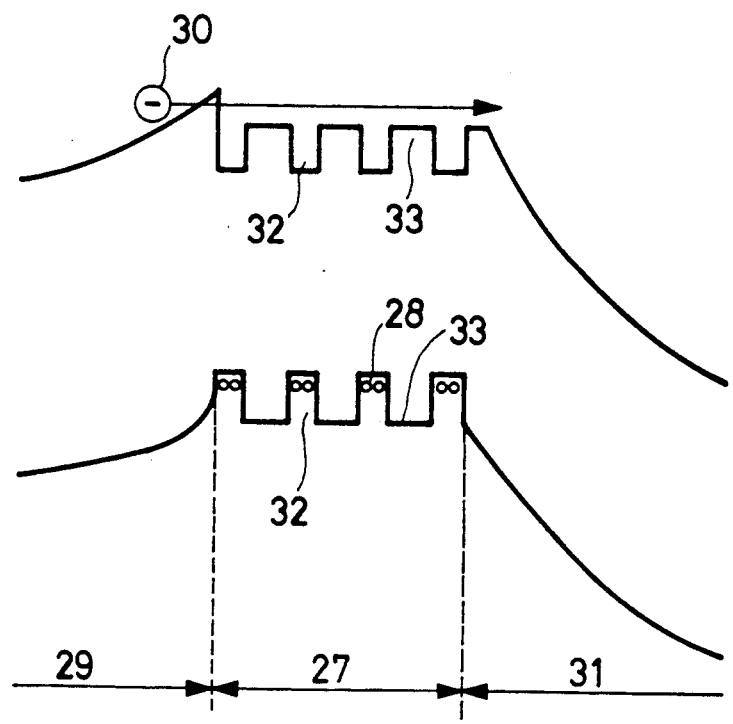
FIG. 2 shows the energy band diagram of the hetero-junction bipolar transistor according to the present invention.
Figure 3:
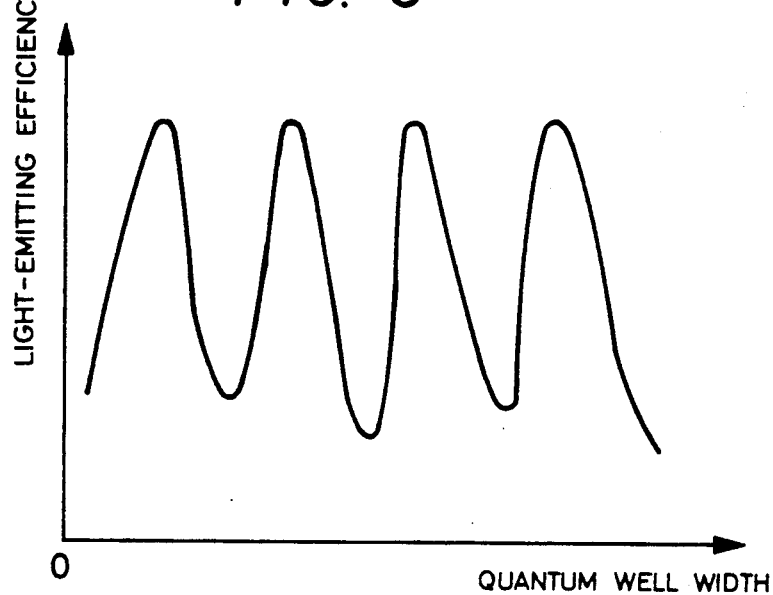
FIG. 3 shows the relationship between the quantum well width and the light-emitting efficiency.

One embodiment of the present invention will be described hereinunder. In this embodiment, Si-doped $Al_{0.3}Ga_{0.7}As$ was employed as an emitter layer 15, and a hetero-junction was formed between the emitter layer 15 and a base layer 14. Si-doped $Al_{0.2}Ga_{0.8}As$ was employed as a collector layer 13, and undoped GaAs and Be-doped $Al_{0.2}Ga_{0.8}As$ were respectively employed as a quantum well layer 21 and a barrier layer 22 constituting in combination the base layer 14. Four quantum wells were provided.

In the quantum well structure of the base layer, when GaAs and $Al_xGa_{1-x}As$ are employed as the quantum well layer 21 and the barrier layer 22, respectively, if the relationship between the composition ratio x of Al in $Al_xGa_{1-x}As$ and the width of the quantum well layer 21 is within the following range, the quantum level and the energy in the barrier layer 22 coincide with each other within a range of $\pm kT/2$:

When $x = 0.1 \pm 0.05$, the width of the quantum well layer is from 60 to 88 Å, from 108 to 138 Å, or from 158 to 200 Å.

When $x = 0.2 \pm 0.05$, the width of the quantum well layer is from 53 to 77 Å, from 97 to 121 Å, from 141 to 165 Å, or from 185 to 220 Å.

When $x = 0.3 \pm 0.05$, the width of the quantum well layer is from 40 to 70 Å, from 85 to 115 Å, or from 130 to 170 Å.

In this embodiment, since the barrier layer in the quantum well structure of the base layer was made of $Al_{0.2}Ga_{0.8}As$ (i.e., $x = 0.2$), the width of the quantum well was set at 65 Å in the above-described range.

Figure 4:
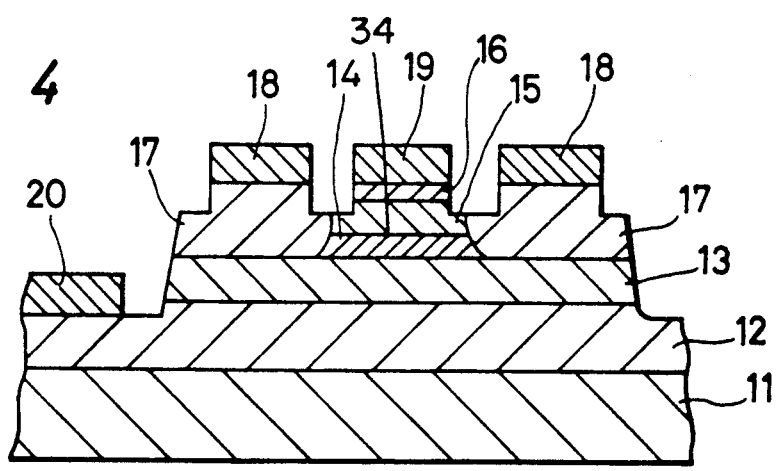
FIG. 4 shows a cross-sectional structure of a hetero-junction bipolar transistor according to one embodiment of the present invention.

FIG. 4 is a sectional view of an HBT according to one embodiment of the present invention. This HBT was formed as follows.

Figure 5:
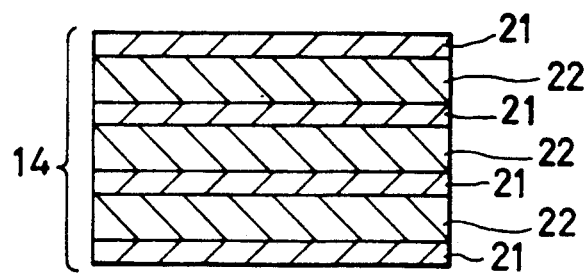
FIG. 5 is an enlarged view of the base layer portion of the hetero-junction bipolar transistor shown in FIG. 4.

On a semi-insulative GaAs substrate 11 are successively grown by molecular beam epitaxy an $n^+$.Si-doped GaAs buffer layer 12 (1.0 μm, $3 \times 10^{18}$ cm$^{-3}$), a collector layer 13 (Si-doped $Al_{0.2}Ga_{0.8}As$, 0.25 μm, $2 \times 10^{16}$ cm$^{-3}$), a Be-modulation doped quantum well base layer 14, an emitter layer 15 (Si-doped $Al_{0.3}Ga_{0.7}As$, 0.2 μm, $2 \times 10^{17}$ cm$^{-3}$) and an $n^+$.Si-doped contact layer 16 (0.03 μm, $3 \times 10^{18}$ cm$^{-3}$). The above-described buffer layer 12 is usually formed on the substrate for the purpose of improving characteristics of the HBT and therefore it may be omitted. The base layer 14 is, as shown in FIG. 5 which is an enlarged view, formed by alternately stacking four undoped GaAs layers 21 (65 Å) and three $p^+-Al_{0.2}Ga_{0.8}As$ layers 22 (Be-doped, $2 \times 10^{19}$ cm$^{-3}$, 200 Å), the GaAs quantum well layers and AlGaAs barrier layers forming in combination a quantum well structure. If the AlGaAs barrier layers have a thickness such as that described above, it is possible to ignore the interaction caused by electrons between each pair of adjacent quantum wells. Next, at the base electrode forming position only, diffusion of Zn is carried out to a depth of about 0.25 to 0.4 μm using as a mask an $Si_3N_4$ film of 3000 Å which is formed by plasma CVD and then patterned. Next, mesa-etching is carried out until the $n^+$-GaAs layer 12 is exposed, and Au/Ge/Ni is evaporated on all of the collector, base and emitter regions and then alloyed at 420° C. for 20 seconds. Thereafter, the base and the emitter are subjected to recess-etching to reach completion.

Measurement of characteristics of the device of the present invention found that the maximum value of the differential DC gain was 1200 when the collector current density was 1 KA/cm$^2$, the measured value being the highest among those in the existing HBTs. The cut-off frequency was 12 GHz; thus, it was possible to achieve a substantial improvement over the heretofore maximum value, i.e., 11 GHz.

Further, since the mobility of holes in the base layer can be increased to about 4 times that in the case of the conventional HBTs, it is possible to lower the base resistance to about ¼ for the same impurity concentration. The two-dimensional trapping of holes into the quantum well enables the hole current injected from the base to the emitter to be reduced to 1/10 or less of that in the prior art and therefore permits an improvement in the emitter injection efficiency. Since lowering in the base transport factor as a result of the provision of the quantum well is 1 to 2%, the current gain is increased by about 10 times that of the prior art.

It should be noted that, although in the above-described embodiment GaAs/AlGaAs is employed to form a quantum well structure, other materials, for example, InAlAs/InGaAs or the like, may be employed to obtain similar effects by selecting a quantum well width so that the quantum level and the energy in the barrier layer are coincident with each other within a range of $\pm kT/2$.

We claim:

1. A hetero-junction bipolar transistor having at least one hetero-junction and including an emitter region, a base region and a collector region, said bipolar transistor comprising at least one quantum well in said base region, said quantum well being formed from a well layer defined by a semiconductor layer having a predetermined energy bandgap and a barrier layer defined by a semiconductor layer having a thickness larger than 20 nm and having an energy bandgap larger than the predetermined energy bandgap of said well layer, and which is formed adjacent to said well layer, wherein said emitter region is comprised of a semiconductor region having an energy level of a conduction band which is a higher level than that of said barrier layer, and wherein a width of said quantum well and an energy level difference between respectively energy bandgaps of said well layer and said barrier layer are determined so that the energy level difference between one of the quantum levels formed in said quantum well and the conduction band of said barrier layer is within $\pm kT/2$ (where k is the Boltsmann's constant and T is the absolute temperature.

2. A hetero-junction bipolar transistor according to claim 1, wherein there are a plurality of said quantum wells which are formed in said base region (14, 27).

3. A hetero-junction bipolar transistor according to claim 1, wherein said barrier layer constituting said quantum well has an impurity selectively doped therein.

4. A hetero-junction bipolar transistor according to claim 1, wherein said barrier layer constituting said quantum well is made of a direct bandgap semiconductor.

5. A hetero-junction bipolar transistor according to claim 4, wherein said well layer constituting said quantum well is made of GaAs, while said barrier layer is made of $Al_xGa_{1x}As$.

* * * * *